(12) United States Patent  
Mathe et al.

(10) Patent No.: US 7,042,096 B2
(45) Date of Patent: May 9, 2006

(54) SINGLE SEMICONDUCTOR ELEMENT IN A FLIP CHIP CONSTRUCTION

(75) Inventors: Franz Mathe, Traunkirchen (AT); Werner Zurek, Lauffen (DE)

(73) Assignee: Vishy Semiconductor GmbH, Heilbronn (DE)

( * ) Notice: Subject to any disclaimer, the term of this patent is extended or adjusted under 35 U.S.C. 154(b) by 0 days.

(21) Appl. No.: 10/817,338

(22) Filed: Apr. 1, 2004

(65) Prior Publication Data

US 2004/0227168 A1    Nov. 18, 2004

(30) Foreign Application Priority Data

May 15, 2003  (DE)  ................ 103 21 954

(51) Int. Cl.
  *H01L 23/50*  (2006.01)
  *H01L 23/488* (2006.01)
(52) U.S. Cl. ................ 257/773; 257/778
(58) Field of Classification Search ........... 257/81, 257/91, 99, 773–780
  See application file for complete search history.

(56) References Cited

U.S. PATENT DOCUMENTS

| 5,900,654 A * | 5/1999 | Spratt ............. 257/222 |
| 6,127,720 A * | 10/2000 | Nakura et al. ........ 257/509 |
| 6,307,218 B1 | 10/2001 | Steigerwald et al. |
| 6,333,522 B1 * | 12/2001 | Inoue et al. ......... 257/99 |
| 6,642,618 B1 | 11/2003 | Yagi et al. |
| 2003/0032217 A1 * | 2/2003 | Farnworth et al. ...... 438/108 |

FOREIGN PATENT DOCUMENTS

| DE | 69013985 | 3/1995 |
| DE | 19953160 | 5/2000 |
| DE | 10162223 | 8/2002 |
| DE | 10153176 | 3/2003 |
| JP | 56033845 A * | 4/1981 |
| JP | 09008274 | 1/1997 |

OTHER PUBLICATIONS

Harper; Electronic Packaging and Interconnection Handbook; 1991; McGraw-Hill, Inc., New York; pp. 10.49.*
U.S. Appl. Publication No. US 2001/0038103 A1, Nov. 8, 2001, Nitta et al.
Standard Flip Chip Design Guide, Bump Design Guide, Kulicke & Soffa, Flip Chip Division, Nov. 15, 2001, pp. 1 to 13.

* cited by examiner

*Primary Examiner*—Howard Weiss
*Assistant Examiner*—Marcos D. Pizarro-Crespo
(74) *Attorney, Agent, or Firm*—W. F. Fasse; W. G. Fasse

(57) ABSTRACT

A substrate layer is provided at the rear side of a single semiconductor element. An active layer is arranged between the substrate layer and a contact side of the single semiconductor element. At least two solder contacts are electrically connected to the active layer and project beyond the contact side in order to make possible a direct soldering of the single semiconductor element to a carrier board. The contact side is provided with a glass passivation layer. Alternatively or additionally to this, at least one side face of the single semiconductor element is provided with an insulator layer in order to avoid short circuits on the soldering of the single semiconductor element to the carrier board. It is furthermore possible for the solder contacts to have different outlines at the contact side.

28 Claims, 2 Drawing Sheets

SINGLE SEMICONDUCTOR ELEMENT IN A FLIP CHIP CONSTRUCTION

Figure 1:
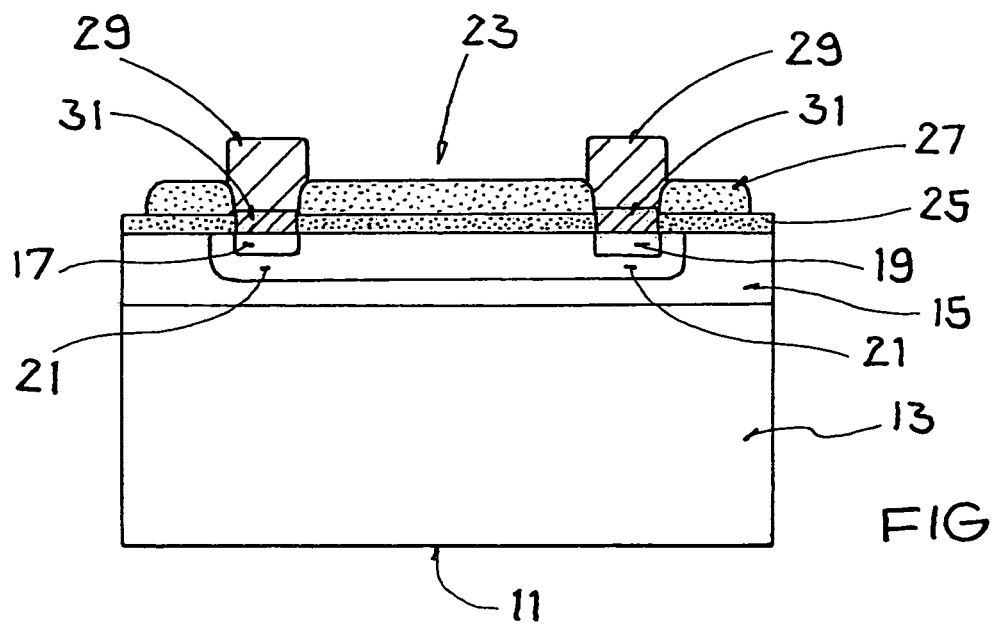

The invention relates to a single semiconductor element, in particular to a diode or to a transistor, in a flip chip construction. Such a single semiconductor element has a substrate layer at its rear side as well as an active layer. The active layer contains the electrically active semiconductor components and it is arranged between the substrate layer and a contact side of the single semiconductor element lying opposite the rear of the single semiconductor element.

Such a single semiconductor element moreover has a plurality of solder contacts which are electrically connected to the active layer and project beyond the contact side of the single semiconductor element in order to make possible a direct soldering of the single semiconductor element to a carrier board. These solder contacts are metal contacts which are capable of soldering and which are in particular connected to an anode or cathode region of the active layer via an intermediate metal layer and/or via a bondable conductor track.

The flip chip construction is conventionally used in IC technology, with a chip, which has a plurality of integrated semiconductor elements and a correspondingly large number of solder contacts, being fastened to a carrier board. For this purpose, the contact side of the chip is placed onto the carrier board and directly connected to it in that the solder contacts of the chip are soldered to the carrier board. Such a chip is usually protected by a thin oxide film produced in CVD (chemical vapor deposition) technology.

A problem in such integrated circuits in flip chip construction lies in the fact that a large number of comparatively small solder contacts are arranged very close to one another at the contact side. To nevertheless ensure a reliable electrical contact, and simultaneously a mechanically stable seat, of the chip at the carrier board for all solder contacts, the contact side of the chip is provided with a so-called underfill. This is an insulating substance which is introduced between the solder contacts utilizing the capillary effect.

This conventional design of an IC chip in flip chip construction is not suitable for a single semiconductor element, that is for a discrete component such as an individual diode, a multi-diode or an individual transistor, without difficulty with respect to the assembly and to the operating reliability It is therefore an object of the invention to provide a single semiconductor element which has high operating reliability for a flip chip construction with a simple design. A corresponding manufacturing method should also be provided.

In accordance with a first embodiment of the invention, this object is satisfied by a single semiconductor element having the features that the contact side of the semiconductor element is provided with a glass passivation layer which surrounds the solder contacts around the periphery at the contact side of the single semiconductor element.

This glass passivation layer protects the single semiconductor element at the contact side particularly effectively without a complex housing wall being required there. The glass passivation layer is breached by the solder contacts so that a problem free soldering of the single semiconductor element to a carrier board continues to be possible.

The glass passivation layer passivates the contact side in that damaging substances from the environment are blocked or bound. A glass is used for this purpose which itself has few content substances, or none at all, which could bring about damage in the semiconductor substrate—for example by diffusion. Such glass materials are made, for example, by the companies of Schott in Landshut (Germany) or Viox in Seattle (Wash., USA).

An advantage of such a glass passivation layer at the contact side of the single semiconductor element therefore lies in a particularly good protection in handling, in assembly and in the operation of the single semiconductor element. This special protective effect is in particular due to the fact that the thickness of the glass passivation layer is significantly larger than the thickness of known protective layers. The thickness of the glass passivation layer is, for example, larger by a factor of 5 to 10 than a conventional oxide layer which is applied in CDV technology.

A further advantage of the glass passivation layer for the use in the flip chip construction lies in the mechanical stabilization of the single semiconductor element soldered to a carrier board. Particularly with single semiconductor elements which are prone to an unwanted tilting at the carrier board due to the low number of solder contacts in comparison with IC chips, a mechanically permanently stable seat at the carrier board is difficult to realize. The explained glass passivation layer does not only contribute to an improved protection due to its comparatively large thickness, but also to an increased mechanical stability such that, in contrast to conventional flip chip construction, no additional so-called underfill is required.

An advantage of the explained glass passivation layer further lies in the fact that this can be applied to the contact side of an individual semiconductor element in a particularly problem free manner, for example after a so-called sedimentation process. This is due to the fact that a single semiconductor element has a relatively low number of solder contacts in comparison with IC chips and has a correspondingly large spacing between the solder contacts.

In an advantageous method for the manufacture of a single semiconductor element in accordance with the explained first embodiment, a substrate layer is provided with an active layer and subsequently the active layer is connected electrically effectively to at least two solder contacts which project beyond a contact side of the single semiconductor element. After or even prior to the production of the solder contacts, the contact side of the single semiconductor element is provided with a glass passivation layer in the environment of the solder contacts.

For this purpose, the contact side is wetted with a suspension in which glass particles are held largely in suspension in a primarily alcoholic liquid mixture. The glass particles are therefore only weakly subject to gravity; however, they can gradually be precipitated directly from the suspension layer located above them without any further action or by centrifuging and then be dried on the contact side of the single semiconductor element. The glass particle layer produced at the contact side in this manner is subsequently heated or burned in order to fuse the deposited glass particles and thus to connect them to the single semiconductor element. This method for the production of the glass passivation layer is also known as sedimentation.

If is preferred for the metalization processes, for example the application of a conductor track made of aluminum, the application of an intermediate metal layer or the application of a metal contact which can be soldered, only to be carried out after the explained application of the glass passivation layer since the metalization processes require lower temperatures than the explained glass burning.

It is of advantage that the glass passivation layer can be structured in a simple manner in order to keep free, or subsequently liberate, the contact side of the single semiconductor element from the glass passivation layer, for example in the region of the solder contacts or along a provided dividing grid. For this purpose, in particular a photo-lithographic process—known per se—can be used. The glass passivation layer is preferably initially—that is prior to the metalization processes—applied in full area to the contact side and subsequently fused on or burned. The glass passivation layer is then photo-lithographically structured, i.e. it is covered with lacquer at those positions at which it should be maintained and the lacquer is removed from those positions at which the glass should be etched away. The metalization can take place after the etching.

In this production method, the glass passivation layer is preferably applied to an oxide layer or to another comparatively thin insulator layer which has previously been applied to the active layer of the single semiconductor element. However, this is not obligatory.

This single semiconductor element is preferably not produced separately, but together with a plurality of single semiconductor elements of the same kind on the basis of a common substrate (wafer). For this purpose, the respective contact side of the plurality of semiconductor elements is kept free from the glass passivation layer, or subsequently liberated from it, along a dividing grid, as already explained above. The single semiconductor elements are subsequently separated in that they are sawn apart along the dividing grid. A plurality of single semiconductor elements can thus be produced in a manner known per se on the basis of a common substrate, with the only local application of the glass passivation layer outside the provided dividing grid ensuring that no mechanical strains are transferred to the glass passivation layer during the sawing apart. Damage to the glass passivation layer is hereby avoided.

In accordance with a second embodiment, the explained object is satisfied by a single semiconductor element having the features that at least one side face of the single semiconductor element is provided at least partly with an insulator layer for the avoidance of short circuits on the soldering of the single semiconductor element to the carrier board.

It is therefore ensured in this embodiment that, after the soldering of the single semiconductor element to the carrier board in question, the non insulated outer surfaces of the single semiconductor element are significantly spaced apart from the carrier board or from solder balls present there. A short circuit between the soldered single semiconductor element and a conductor track of the carrier board is thereby particularly effectively avoided. This is in particular important with small single semiconductor elements since short circuits can occur particularly easily in a miniaturized environment due to excess solder.

The said insulator layer is in particular an oxide layer of the substrate used.

It is of advantage if at least those side faces of the single semiconductor element are provided with the insulator layer which adjoin a solder contact in direct proximity in each case. However, for a particularly reliable avoidance of short circuits, all side faces of the single semiconductor element are preferably provided with the insulator layer.

With respect to the height of the insulator layer at the respective side face of the single semiconductor element, it can already be sufficient for at least a quarter of the side face in question—starting from the contact side—to be provided with the insulator layer. It is, however, preferred for at least a third, or a half, of the side face in question to be provided with the insulator layer adjoining the contact side. A particularly good protective effect is naturally achieved if the side face of the single semiconductor element is completely provided with the insulator layer.

It is particularly preferred if the single semiconductor element is produced in a so-called mesa construction, with so-called trenches etched in at the side and then sawn through. In this case, the insulator layer can be applied after the etching of the trenches, but still before the sawing through, so that it covers the respective side face down to the depth of the original trench in the finished single semiconductor element. A sufficient electrical insulation is ensured in this manner even in an efficient mass production process.

Accordingly, in an advantageous method for the production of a plurality of single semiconductor elements in accordance with the explained second embodiment, it is provided that initially a substrate is provided having a plurality of electrically active regions adjoining one another at the side. Thereupon, dividing trenches are etched into the substrate along a grid between these electrically active regions. Subsequently, the surface of the substrate, including the dividing trenches produced, is provided with an insulator layer, in particular an oxide layer. This preferably takes place in a CVD process. Finally, the substrate is sawn apart along the dividing trenches to produce a plurality of single semiconductor elements.

The explained method has the advantage that a plurality of single semiconductor elements can be produced in conventional production technology and thus in an efficient and cost favorable manner, with each of these semiconductor elements being provided with the explained insulator layer at the side faces down to the depth of the original dividing trenches.

It is also possible in the single semiconductor elements in accordance with the second embodiment for the active layer to be connected electrically to at least two solder contacts which project over the contact side of the single semiconductor element, with the contact side being provided, as explained in connection with the first embodiment, with a glass passivation layer in the environment of the solder contacts.

The explained object is satisfied in accordance with a third embodiment by a single semiconductor element having the features that the at least two solder contacts have different outlines at the contact side of the single semiconductor element.

In this embodiment, a different lateral shape of the two solder contacts is therefore provided with respect to the plane of extent of the single semiconductor element at the contact side. For this purpose, a different shape of the respective outline of the solder contacts can be provided. Alternatively or additionally, that is with the same or a different shape of the outline, the area taken up in each case by the solder contacts at the contact side is of a different size.

These different outlines make possible a simple visual distinguishability of the two solder contacts such that the position of the anode and the position of the cathode cannot easily be confused.

Moreover, the different shape or size of the respective outline of the solder contacts can be chosen such that the standard stability of the single semiconductor element at the relevant carrier board is increased. This is of particular importance in two-terminal devices since there is generally an increased risk of unwanted tilting with a fastening at only two fastening positions.

It is preferred if each of the two solder contacts take up the same area at the contact side of the single semiconductor element. A size of the respective area of the solder contacts which is the same, or at least similar, namely promotes a better processing capability during the soldering process with respect to the surface tension of the solder.

A particularly good processing capability is also achieved when—additionally or alternatively—each of the two solder contacts has the same, or least a similar, peripheral length at the contact side of the single semiconductor element.

To increase the standing stability of the single semiconductor element at the carrier board even further, at least one dummy contact can be provided at the contact side in addition to the two solder contacts. Such a dummy contact is a contact which provides an additional mechanical fastening position due to the soldering of the single semiconductor element to the carrier board without itself being electrically effective. Such a dummy contact can advantageously additionally contribute to the visual distinguishability of the electrically effective solder contacts (anode and cathode) by a suitable arrangement, for example by an asymmetrical arrangement relative to the two solder contacts.

Alternatively to this, at least one of the two electrically effective solder contacts at the contact side of the single semiconductor element can be made in a plurality of parts. This means that the plurality of parts of the relevant solder contact projecting beyond the contact side have the same electrical functionality as an anode or a cathode, but project beyond the contact side at a plurality of positions. A plurality of mechanical fastening positions are also hereby produced to increase the standing stability of the single semiconductor element.

It is furthermore of advantage for at least one of the solder contacts to extend longitudinally along one, more, or all outer edges of the contact side of the single semiconductor element. In such an arrangement of the solder contact, mechanical strains can namely be absorbed particularly uniformly, and thus effectively. Such mechanical strains occur in particular on a change of load in operation of the single semiconductor element.

The explained single semiconductor element in accordance with the third embodiment can also be provided with a glass passivation layer at the contact side, as explained for the first embodiment. Alternatively or additionally, the single semiconductor element in accordance with the third embodiment can be provided with an insulator layer at at least one side face, as explained in connection with the second embodiment. Additional further developments of the invention are recited in the dependent claims.

Figure 2:
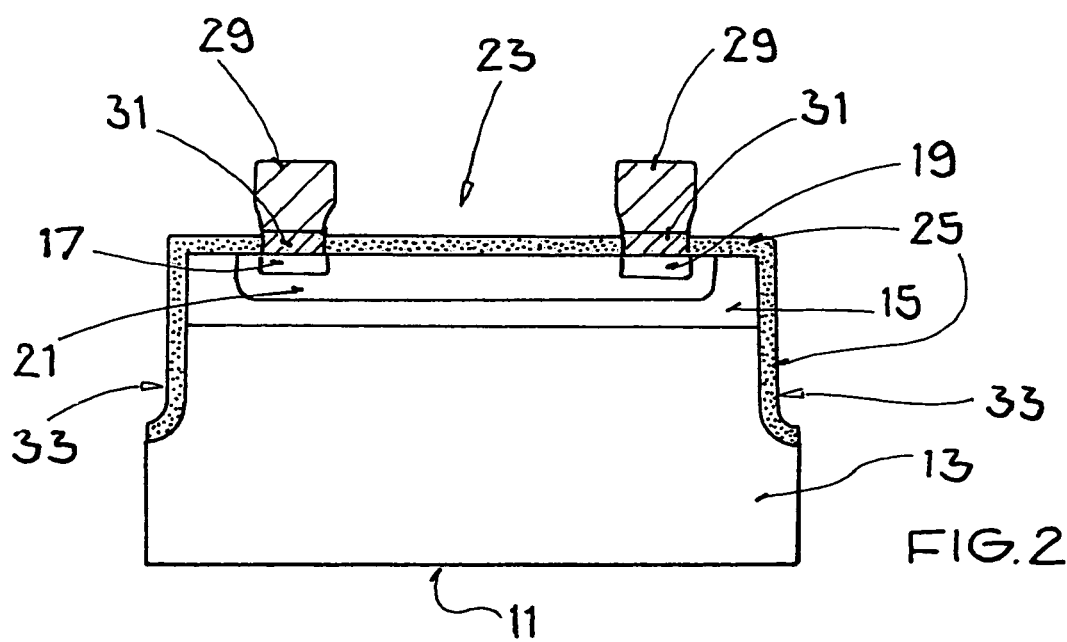
Figure 3:
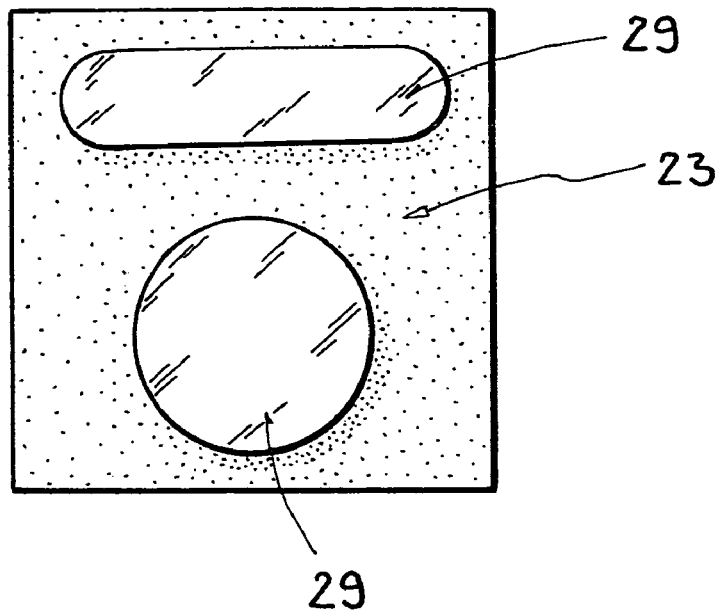
Figure 4:
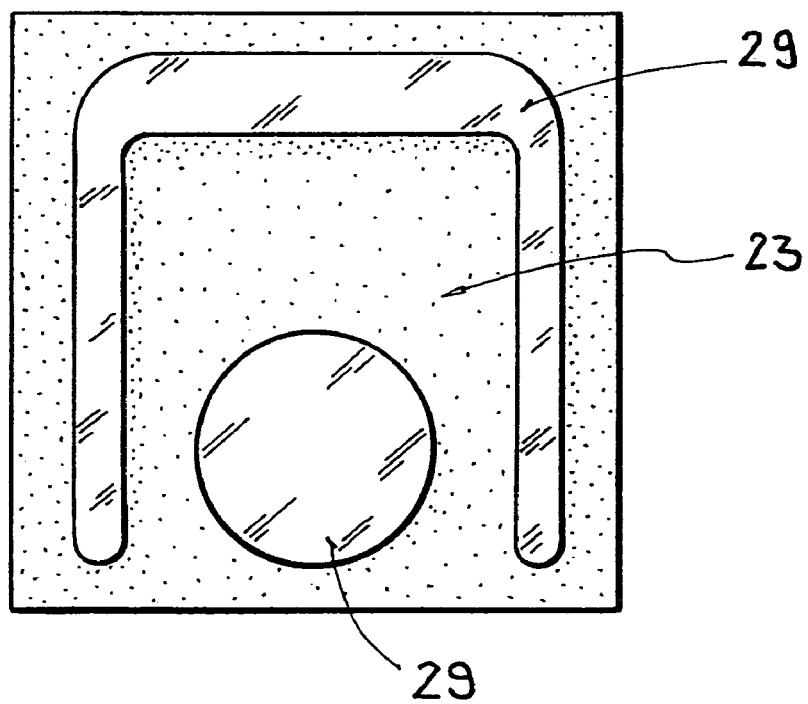

The invention will be explained in the following by way of example with reference to the drawings, in which are shown:

FIG. 1 a schematic side cross-sectional view of a single semiconductor element in accordance with a first embodiment;

FIG. 2 a schematic side cross-sectional view of a single semiconductor element in accordance with a second embodiment; and FIGS. 3 and 4 in each case, a schematic plan view of the contact side of a single semiconductor element in accordance with a third embodiment.

FIG. 1 shows a discrete semiconductor component, namely a diode. This single semiconductor element is provided for the fastening to a carrier board in accordance with the so-called flip chip technology. The carrier board is not shown in the Figures and is also not a subject of the invention.

The single semiconductor element shown in FIG. 1 has, starting from a rear side 11, a substrate layer 13 made of monocrystalline silicon. An active layer 15, in particular an epitaxially grown active layer, adjoins this. A cathode 17 and an anode 19 of different doping are formed within the active layer 15. They are embedded within an electrically active region 21 of the active layer 15.

The side of the single semiconductor element disposed opposite the rear side 11 is made as a contact side 23. The active layer 15 is covered at this contact side 23 by an optional oxide layer 25 which has been deposited, for example, in a CVD process. Adjacent to this, the contact side 23 is terminated by a glass passivation layer 27. This is preferably produced according to the already explained sedimentation process and it can be thicker by a factor between 5 and 10 than the oxide layer 25.

The oxide layer 25 and the glass passivation layer 27 are broached for a respective solder contact 29 in the region of the cathode 17 and of the anode 19. The solder contacts 29 are metal contacts which can be soldered and which are connected to the cathode 17 or to the anode 19 in an electrically effective manner via a respective intermediate metal layer 31. The intermediate metal layers 31 improve the electrical and mechanical connection. The solder contacts 29 project beyond the contact side 23 of the single semiconductor element shown, and indeed at the same height.

The single semiconductor element shown has an electrical functionality, here as a diode, known per se within the electrically active region 21. However, there is a special feature in that this diode is provided as a discrete component for a flip chip assembly at a carrier board. For this purpose, the single semiconductor element is—starting from the position in accordance with FIG. 1—turned around and placed from above onto the relevant carrier board with the contact side 23 facing downward such that the overhanging solder contacts 29 contact corresponding contact positions of the carrier board. A solder connection is established with the carrier board by heating the solder contacts 29 so that an electrical and a mechanical connection are made at the same time.

The single semiconductor element in accordance with FIG. 1 is in particular characterized by the glass passivation layer 27 which areally covers the contact side 23 and peripherally surrounds the solder contacts 29. This glass passivation layer 27 provides an effective mechanical protection for the contact side 23 during the handling and working of the still separated component.

The glass passivation layer 27 also simplifies the explained application of the single semiconductor element to a carrier board since this single semiconductor element with the glass passivation layer 27 can contact the carrier board without problem without there being a risk of mechanical damage, of diffusion of damaging substances or of producing electrical short-circuits. At the same time, the glass passivation layer 27 promotes the mechanical standing stability of the component soldered to the carrier board such that no additional mechanical support measures are required.

As shown in FIG. 1, the glass passivation layer 27 can also be interrupted at the outer edges of the contact side 23 of the single semiconductor element. This is of particular advantage if a plurality of similar single semiconductor elements are produced at one single substrate with one respective glass passivation layer 27 which are separated by sawing apart of the substrate. If, namely—as shown in FIG. 1—the glass passivation is interrupted along the dividing grid provided for the sawing, this sawing does not result in unwanted mechanical strains at the respective glass passivation layer 27.

FIG. 2 shows a single semiconductor element in accordance with a second embodiment. This has a similar design to the flip chip diode in accordance with FIG. 1. Starting from a rear side 11 of the single semiconductor element shown in FIG. 2, there extend a substrate layer 13 and—adjoining it—an active layer 15 with an electrically active region 21 within which a cathode 17 and an anode 19 are formed. The cathode 17 and the anode 19 are each provided at a contact side 23 of the single semiconductor element with an intermediate metal layer 31 to which a respective solder contact 29 is applied. The solder contacts 29 project beyond the otherwise areal contact side 23—at the same height.

The single semiconductor element shown in FIG. 2 is produced in a so-called mesa construction, with recesses 33 at the side faces of the single semiconductor element. These recesses 33 result from etched V-shaped trenches as will be explained in the following. The recesses 33 extend, starting from the contact side 23, in the direction of the rear side 11 beyond half the thickness of the single semiconductor element.

A special feature of the single semiconductor element shown in FIG. 2 lies in the fact that it is provided with an oxide layer 25 which does not only areally cover the contact side 23—with breaches for the solder contacts 29. This oxide layer 25 rather also covers the lateral recesses 33 down to their depths.

The single semiconductor element in accordance with FIG. 2 also has a customary electrical functionality, for example as a diode or—if an additional electrically effective solder contact 29 is provided—as a transistor. This discrete component is also provided for a flip chip connection to a carrier board, as already explained in connection with FIG. 1.

A particular advantage of the single semiconductor element in accordance with FIG. 2 lies in the fact that the oxide layer 25 extends along the recesses 33 and thus along a large part of the respective side face. As soon as the shown single semiconductor element has been soldered to a carrier board at its contact side 23, the oxide layer 25 ensures that electrical short circuits cannot easily occur between the single semiconductor element and the carrier board due to excess solder. It is of particular advantage here that the oxide layer 25 extends—starting from the contact side 23—continuously up to the recesses 33 or to the corresponding side faces. A minimum spacing of the non insulated regions of the single semiconductor element from the carrier board is hereby ensured.

A further advantage lies in the fact that this additional side insulation can be produced without any large additional effort as part of a customary production process. Starting from a common substrate, a plurality of similar single semiconductor elements can namely be produced in that the respective active layer 15 is produced with a cathode 17 and an anode 19 along a pre-determined arrangement pattern within an electrically active region 21. Alone a grid, the substrate is provided with dividing trenches which extend between the respective electrically active regions 21 and are, for example, etched into the substrate. Subsequently, the substrate surface, including the dividing trenches etched into it, is provided with the oxide layer 25. The substrate is then sawn apart along the dividing trenches.

A plurality of single semiconductor elements are produced in this manner which are provided, as shown in FIG. 2, with an oxide layer 25 at the side faces along the extent of the original dividing trenches.

It must still be mentioned with respect to the single semiconductor element in accordance with FIG. 2 that, with a square or rectangular outline, it can also be provided with the explained oxide layer 25 at all four side faces, in particular due to a peripheral extent of the etched dividing trenches in the explained production process.

This single semiconductor element can moreover additionally be provided with a glass passivation layer 27 at the contact side 23, as explained in connection with FIG. 1. It is generally even possible for a glass passivation layer to be applied (in place of the oxide layer 25 shown in FIG. 2) which also extends along the recesses 33.

FIGS. 3 and 4 show the contacting side 23 of a third embodiment of a respective flip chip single semiconductor element. This single semiconductor element can have a customary design, as explained in connection with FIGS. 1 and 2, comprising a substrate layer 13 at the rear side, an active layer 15 with a cathode 17 and an anode 19 formed thereon, as well as comprising a protective layer, in particular an oxide layer 25, at the contact side 23 and solder contacts 29 projecting beyond this. It is of particular advantage if the single semiconductor element in accordance with FIG. 3 or in accordance with FIG. 4 is additionally provided with a glass passivation layer 27 in accordance with FIG. 1 and/or with a side oxide layer 25 in accordance with FIG. 2.

A special feature of the single semiconductor element in accordance with FIG. 3 lies in the fact that the two solder contacts 29 have a different shape of the respective outline. The one solder contact 29 has a circular outline, while the outline of the other of the two solder contacts 29 has an elongate shape. Due to these different shapes, the two solder contacts 29 can be visually distinguished from one another without problem so that, with a known association of the anode and of the cathode of the component to the solder contacts 29, the anode and the cathode cannot easily be confused on the soldering of the component to a carrier board.

A further advantage of the single semiconductor element in accordance with FIG. 3 lies in the fact that the two solder contacts 29 at the contact side 23 each take up approximately the same area and also each have approximately the same peripheral extent there. A similar dimension of the area taken up at the contact side 23 improves the processing capability of the single semiconductor element on the soldering to a carrier board with respect to disturbing effects which can result from the surface tension of the solder. The similar lengths of the periphery of the solder contacts 29 in accordance with FIG. 3 respectively taken up also simplify the fastening of the single semiconductor element to a carrier board in the course of a solder process.

A further advantage of this embodiment lies in the fact that the two solder contacts 29 have a comparatively large surface portion at the contact side 23—for example with respect to two substantially point-shaped contacts. A stable seat of the soldered single semiconductor element at the carrier board is hereby ensured.

Finally, the elongate design of the one solder contact 29 perpendicular to the direction of arrangement of the two solder contacts 29 also contributes to a stable seat of the single semiconductor element at the carrier board, since a tilting perpendicular to the direction of arrangement of the two solder contacts 29 is hereby precluded.

In the single semiconductor element in accordance with FIG. 4, one of the two solder contacts 29 has a U-shaped outline and extends along three outer edges of the contact side 23 of the shown single semiconductor element. The other of the two solder contacts 29 has a circular outline and is arranged within this U shape.

The shown extent of the one solder contact 29 along a plurality of outer edges of the contact side 23 effects a good cushioning of possible stretching effects which can in particular occur on a change in load in the operation of the single semiconductor element.

The two solder contacts 29 are moreover particularly easily visually distinguishable from one another due to the very different shapes of their respective outlines in order to be able to mark the cathode and the anode hereby.

Alternatively to the U shape of the one solder contact 29 in accordance with FIG. 4, its outline can also be rounded to form a C shape. The other solder contact 29 in accordance with FIG. 4 also does not necessarily have to be circular, but can, for example, also be square, rectangular or T-shaped, with the transverse bar of the T shape extending along the fourth outer edge of the contact side 23.

It must still be mentioned with respect to the embodiments shown that the explained single semiconductor elements can each have—as a discrete diode—precisely two, or—as a discrete transistor—precisely three electrically active solder contacts 29. Furthermore, the solder contacts 29 can optionally have a non fusible core which serves as a spacer in the fastening of the respective single semiconductor element to a carrier board.

The invention claimed is:

1. A single semiconductor element in a flip chip construction, comprising
    a substrate layer at a rear side of the single semiconductor element;
    an active layer which is arranged between the substrate layer and a contact side of the single semiconductor element disposed opposite the rear side; and
    at least two solder contacts which are electrically connected to the active layer and project beyond the contact side of the single semiconductor element to enable a direct soldering of the single semiconductor element to a carrier board;
    wherein the solder contacts respectively have different peripheral outlines, and the solder contacts respectively have at least one of: (a) the same peripheral length of the respective outlines or (b) the same surface area in comparison to one another, at the contact side of the single semiconductor element.

2. The single semiconductor element in accordance with claim 1, wherein the respective outlines of the solder contacts have different shapes in comparison to one another.

3. The single semiconductor element in accordance with claim 1, wherein the respective outlines of the solder contacts respectively have the same peripheral length at the contact side.

4. The single semiconductor element in accordance with claim 1, further comprising at least one dummy contact in addition to the solder contacts to increase the standing stability.

5. The single semiconductor element in accordance with claim 1, wherein at least one of the solder contacts includes a plurality of contact parts at the contact side of the single semiconductor element.

6. The single semiconductor element in accordance with claim 1, wherein at least one of the solder contacts extends along at least two outer edges of the contact side of the single semiconductor element.

7. The single semiconductor element in accordance with claim 1, wherein at least one of the solder contacts extends along at least three outer edges of the contact side of the single semiconductor element.

8. The single semiconductor element in accordance with claim 1, wherein the outline of a first one of the solder contacts is a circular outline and the outline of a second one of the solder contacts is an elongate outline.

9. The single semiconductor element in accordance with claim 1,
    wherein the outline of a first one of the solder contacts is a U-shaped or C-shaped outline and extends along three outer edges of the contact side (23) of the single semiconductor element; and
    wherein the outline of a second one of the solder contacts is at least partly enclosed inside the U-shaped or C-shaped outline of the first solder contact.

10. The single semiconductor element in accordance with claim 1, wherein the solder contacts respectively have the same surface area in comparison to one another at the contact side.

11. The single semiconductor element in accordance with claim 10, wherein the respective outlines of the solder contacts respectively have the same peripheral length at the contact side.

12. The single semiconductor element in accordance with claim 1, further comprising a glass passivation layer that peripherally surrounds the solder contacts on the contact side.

13. The single semiconductor element in accordance with claim 12, wherein the glass passivation layer is interrupted in a region of the solder contacts and in a region of a dividing grid between a plurality of said single semiconductor elements produced adjacent to one another.

14. The single semiconductor element in accordance with claim 12, further comprising an oxide layer provided between the glass passivation layer and the active layer.

15. The single semiconductor element in accordance with claim 12, further comprising an intermediate metal layer by which the solder contacts are connected to the active layer.

16. A method for producing the single semiconductor element in accordance with claim 12 in a flip chip construction, the method comprising the steps of:
    a) providing the active layer on the substrate layer;
    b) producing and electrically connecting the solder contacts to the active layer; and
    c) before or after producing the solder contacts, providing a glass passivation layer that peripherally surrounds the contacts;
    wherein the step of providing the glass passivation layer comprises the sub-steps of:
    c1) wetting the contact side with a suspension such that glass particles contained therein are deposited at the contact side due to gravity or due to a centrifugal force; and
    c2) subsequently heating the contact side to fuse the deposited glass particles.

17. The method in accordance with claim 16, wherein the step c) involves first providing the glass passivation layer over the whole area of the contact side and then photolithographically patterning the glass passivation layer so that the contact side is liberated from the glass passivation layer in the region of the solder contacts.

18. The method in accordance with claim 16, wherein
    the single semiconductor element is produced together with a plurality of other single semiconductor elements on a common substrate,
    the contact sides of the single semiconductor elements are kept free or liberated from the glass passivation layer along a dividing grid, and
    the single semiconductor elements are sawn apart along the dividing grid.

19. The single semiconductor element in accordance with claim 1, further comprising an insulator layer provided on at least a portion of at least one side face of the single semiconductor element.

20. The single semiconductor element in accordance with claim 19, wherein at least a quarter of the side face of the single semiconductor element adjoining the contact side is provided with the insulator layer.

21. The single semiconductor element in accordance with claim 19, wherein the entirety of the side face of the single semiconductor element is provided with the insulator layer.

22. The single semiconductor element in accordance with claim 19, wherein the single semiconductor element has a mesa construction with lateral etched and sawn-through trenches, with the respective side face being provided with the insulator layer down to the depth of the respective trench.

23. The single semiconductor element in accordance with claim 19,
wherein at least the side faces of the single semiconductor element which respectively directly adjoin a solder contact are provided with the insulator layer;
wherein in particular all side faces of the single semiconductor element are provided with the insulator layer.

24. The single semiconductor element in accordance with claim 19, wherein the contact side is also provided with the insulator layer.

25. The single semiconductor element in accordance with claim 19, wherein the insulator layer is an oxide layer.

26. A method for producing a plurality of single semiconductor elements in accordance with claim 19, wherein
for the preparation of a plurality of the adjacent single semiconductor elements, a substrate is provided with a respective active layer and with dividing trenches lying therebetween;
the active layers and the dividing trenches lying therebetween are provided with an insulator layer; and
the adjacent single semiconductor elements are sawn apart along the dividing trenches.

27. The method in accordance with claim 26, wherein the insulator layer is an oxide layer.

28. The method in accordance with claim 26, wherein the insulator layer is applied in a CVD process.

* * * * *

UNITED STATES PATENT AND TRADEMARK OFFICE
CERTIFICATE OF CORRECTION

| | | |
|---|---|---|
| PATENT NO. | : 7,042,096 B2 | Page 1 of 1 |
| APPLICATION NO. | : 10/817338 | |
| DATED | : May 9, 2006 | |
| INVENTOR(S) | : Mathe et al. | |

It is certified that error appears in the above-identified patent and that said Letters Patent is hereby corrected as shown below:

<u>Title page,</u>
Item [73], Assignee,
Line 1, replace "Vishy" by --Vishay--;

<u>Column 7</u>
Line 53, after "region 21.", replace "Alone" by --Along--.

Signed and Sealed this

Twenty-eighth Day of November, 2006

JON W. DUDAS
*Director of the United States Patent and Trademark Office*